United States Patent
Lassila et al.

(10) Patent No.: US 7,348,300 B2
(45) Date of Patent: *Mar. 25, 2008

(54) ACETYLENIC DIOL ETHYLENE OXIDE/PROPYLENE OXIDE ADDUCTS AND PROCESSES FOR THEIR MANUFACTURE

(75) Inventors: Kevin Rodney Lassila, Westford, MA (US); Paula Ann Uhrin, Allentown, PA (US); Peng Zhang, Quakertown, PA (US); Danielle Megan King Curzi, San Francisco, CA (US); Leslie Cox Barber, Cave Creek, AZ (US); Brenda Faye Ross, Whitehall, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 284 days.

This patent is subject to a terminal disclaimer.

(21) Appl. No.: 11/048,576

(22) Filed: Feb. 1, 2005

(65) Prior Publication Data

US 2005/0176605 A1    Aug. 11, 2005

Related U.S. Application Data

(63) Continuation-in-part of application No. 10/804,513, filed on Mar. 19, 2004, which is a continuation-in-part of application No. 10/616,662, filed on Jul. 10, 2003, now Pat. No. 7,129,199, which is a continuation-in-part of application No. 10/339,709, filed on Jan. 9, 2003, now abandoned, which is a continuation-in-part of application No. 10/218,087, filed on Aug. 12, 2002, now abandoned, application No. 11/048,576, which is a continuation-in-part of application No. 10/689,402, filed on Oct. 20, 2003, now Pat. No. 7,208,049, application No. 11/048,576, which is a continuation-in-part of application No. 10/634,608, filed on Aug. 4, 2003, now abandoned, which is a continuation-in-part of application No. 09/304,607, filed on May 4, 1999, now Pat. No. 6,313,182, application No. 11/048,576, which is a continuation-in-part of application No. 09/975,135, filed on Oct. 11, 2001, now Pat. No. 6,864,395.

(51) Int. Cl.
*C11D 7/30* (2006.01)

(52) U.S. Cl. ........................ 510/175; 510/421; 510/506

(58) Field of Classification Search ..................... None
See application file for complete search history.

(56) References Cited

U.S. PATENT DOCUMENTS

| | | | |
|---|---|---|---|
| 3,268,593 A | 8/1966 | Carpenter et al. | |
| 4,117,249 A | 9/1978 | De Simone et al. | |
| 4,214,924 A * | 7/1980 | Piucci | 148/636 |
| 4,241,224 A | 12/1980 | Newkirk et al. | |
| 4,374,920 A | 2/1983 | Wanat et al. | |
| 4,668,423 A | 5/1987 | Drozd et al. | |
| 4,786,578 A | 11/1988 | Neisius et al. | |
| 4,814,514 A | 3/1989 | Yokota et al. | |
| 4,833,067 A | 5/1989 | Shingo et al. | |
| 4,885,064 A * | 12/1989 | Bokisa et al. | 205/252 |
| 5,098,478 A | 3/1992 | Krishnan et al. | |
| 5,127,571 A | 7/1992 | Gutierrez et al. | |
| 5,466,389 A * | 11/1995 | Ilardi et al. | 510/175 |
| 5,562,762 A | 10/1996 | Mrvos et al. | |
| 5,650,543 A | 7/1997 | Medina | |
| 5,756,267 A | 5/1998 | Kassanao et al. | |
| 5,948,464 A | 9/1999 | Delnick | |
| 5,977,041 A | 11/1999 | Honda | |
| 6,152,148 A | 11/2000 | George et al. | |
| 6,261,745 B1 * | 7/2001 | Tanabe et al. | 430/331 |

(Continued)

FOREIGN PATENT DOCUMENTS

EP    0178495 B1    3/1990

(Continued)

OTHER PUBLICATIONS

Domke, W. D., et al., "Pattern Collapse in High Aspect Ratio DUV and 293nm Resists", Proc. SPIE-Int. Soc. Opt. Eng. 3999, 313-321, 2000.

(Continued)

*Primary Examiner*—Gregory Webb
(74) *Attorney, Agent, or Firm*—Joseph D. Rossi

(57) ABSTRACT

Disclosed herein are process solutions, which may be aqueous-based, non-aqueous-based, and combinations thereof, that contain at least one alkoxylated acetylenic diol surfactant. In one aspect, the process solution comprises water and an alkoxylated acetylenic diol surfactant having the formula A:

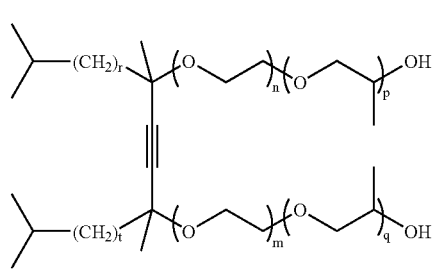

where r and t are 1 or 2, (n+m) is 1 to 30 and (p+q) is 1 to 30.

10 Claims, No Drawings

U.S. PATENT DOCUMENTS

| | | |
|---|---|---|
| 6,284,718 B1 | 9/2001 | Simon |
| 6,310,019 B1 | 10/2001 | Kakizawa et al. |
| 6,313,182 B1 * | 11/2001 | Lassila et al. ............... 516/204 |
| 6,455,234 B1 * | 9/2002 | Lassila et al. ............... 430/325 |
| 6,465,403 B1 | 10/2002 | Skee |
| 6,514,330 B1 * | 2/2003 | Kanaya et al. ........... 106/31.49 |
| 6,585,825 B1 | 7/2003 | Skee |
| 6,641,986 B1 | 11/2003 | Zhang et al. |
| 6,670,107 B2 | 12/2003 | Lachowski |
| 6,864,395 B2 * | 3/2005 | Lassila et al. ............... 568/606 |
| 2001/0021489 A1 | 9/2001 | Wakiya et al. |
| 2002/0016272 A1 | 2/2002 | Masahiko et al. |
| 2002/0055660 A1 | 5/2002 | Lassila et al. |
| 2002/0077259 A1 | 6/2002 | Skee |
| 2002/0106589 A1 | 8/2002 | Rodney et al. |
| 2002/0115022 A1 | 8/2002 | Messick et al. |
| 2002/0121287 A1 | 9/2002 | Gilton |
| 2003/0228762 A1 | 12/2003 | Moeggenborg et al. |
| 2003/0228763 A1 | 12/2003 | Schroeder et al. |
| 2004/0029395 A1 | 2/2004 | Zhang et al. |
| 2004/0029396 A1 | 2/2004 | Zhang et al. |
| 2004/0053172 A1 | 3/2004 | Zhang et al. |
| 2004/0053800 A1 | 3/2004 | Zhang et al. |
| 2004/0149309 A1 | 8/2004 | Hsu |

FOREIGN PATENT DOCUMENTS

| | | |
|---|---|---|
| EP | 0231028 B1 | 8/1991 |
| EP | 1065708 A2 | 1/2001 |
| EP | 1 115 035 A | 7/2001 |
| EP | 1 389 745 A | 2/2004 |
| JP | 3063187 A | 3/1991 |
| JP | 4071894 | 3/1992 |
| JP | 4091168 | 3/1992 |
| JP | 6279081 | 10/1994 |
| JP | 95142349 | 6/1995 |
| JP | 96008163 | 1/1996 |
| JP | 1996183663 A | 7/1996 |
| JP | 2621662 | 6/1997 |
| JP | 9150577 | 6/1997 |
| JP | 2569377 | 8/1997 |
| JP | 2636954 | 8/1997 |
| JP | 10114880 | 5/1998 |
| JP | 1999080639 A | 3/1999 |
| JP | 1999256087 A | 9/1999 |
| JP | 11352703 | 12/1999 |
| JP | 2002020787 | 1/2002 |
| JP | 2002148821 | 5/2002 |
| JP | 2004184648 A | 7/2004 |
| WO | WO 8703387 | 6/1987 |
| WO | WO 9915609 | 4/1999 |
| WO | WO 9960083 | 11/1999 |
| WO | WO 9960448 | 11/1999 |
| WO | WO 0003306 | 1/2000 |
| WO | WO 00/14785 | 3/2000 |
| WO | WO 00/18523 | 4/2000 |
| WO | WO 0223598 | 3/2002 |
| WO | WO 2004/051379 | 6/2004 |

OTHER PUBLICATIONS

Cheung, C., et al. "A Study of a single Closed Contact for 0.18 Micron Photolithography Process," Proc. SPIE-Int. Soc. Opt. Eng. 3998, 738-741, 2000.

S. Hein, et al., "Collapse behavior of single layer 293 and 157 nm resists: Use of surfactants in the rinse to realize the sub 130 nm nodes", Infineon Technologies, International SEMATECH, Center for Nano Technology, University of Wisconsin, (2002).

T. Tanaka, et al., "Mechanism of Resist Pattern Collapse During Development Process", Jpn. J. Appl. Phys. vol. 32 (1993), pp. 6059-6064, Part 1, No. 12B.

P. Zhang, et al., "Surface Conditioning Solutions to Reduce Resist Line Roughness", Air Products and Chemicals, Inc., SPIE International symposium Microlithography, Feb. 22-27, 2004, Santa Clara, CA.

Schwartz, J., "The Importance of low Dynamic Surface Tension in Waterborne Coatings", Journal of Coatings Technology, Sep. 1992.

Wirth, W.; Storp, S., Jacobsen, W., "Mechanisms Controlling Leaf Retention of Agricultural Spray Solutions", Pestic. Sci. 1991, 33, 411-420.

Medina, S. W., Sutovich, M. N., "Using Surfactants to Formulate VOC Compliant Waterbased Inks", Am. Ink Maker 1994, 72 (2) 32-38.

Leeds, et al., I&EC Product Research and Development 1965, 4, 237.

* cited by examiner

ACETYLENIC DIOL ETHYLENE OXIDE/PROPYLENE OXIDE ADDUCTS AND PROCESSES FOR THEIR MANUFACTURE

CROSS-REFERENCE TO RELATED APPLICATIONS

This application is a continuation-in-part of U.S. patent application Ser. No. 09/975,135, filed 11 Oct. 2001, now U.S. Pat. No. 6,864,395 which is a continuation-in-part of 09/304,607, filed 4 May 1999, now U.S. Pat. No. 6,313,182 the disclosures of which are incorporated herein by reference in their entireties. This application is also a continuation-in-part of U.S. patent application Ser. No. 10/634,608, filed 4 Aug. 2003, now abandoned which is a continuation-in-part of issued U.S. Pat. No. 09/304,607, filed May 4, 1999, the disclosures of which are incorporated herein by reference in their entireties. This application is also a continuation-in-part of U.S. patent application Ser. No. 10/804, 513 filed 19 Mar. 2004, which is a continuation-in-part of 10/616,662 filed 10 Jul. 2003, now U.S. Pat. No. 7,129,199 which is a continuation-in-part of 10/339,709, filed 9 Jan. 2003, now abandoned which is a continuation-in-part of 10/218,087, filed 12 Aug. 2002, now abandoned the disclosures of the foregoing applications are incorporated herein by reference in their entirety. This application is also a continuation-in-part of 10/689,402, filed 20 Oct. 2003, now U.S. Pat. No. 7,208,049 the disclosure of which is incorporated herein by reference in its entirety.

BACKGROUND OF THE INVENTION

The invention relates to acetylenic diol alkylene oxide adducts, or alkoxylated acetylenic diols, and their manufacture and their use to reduce the surface tension in aqueous-based and/or non-aqueous based process solutions.

The ability to reduce the surface tension of water is of great importance in waterborne coatings, inks, adhesives, agricultural formulations, and process solutions such as rinse, pre-treatment, or other solutions for the electronics industry because decreased surface tension translates to enhanced substrate wetting in actual formulations. Surface tension reduction in water-based systems is generally achieved through the addition of surfactants. Equilibrium surface tension performance is important when the system is at rest, though the ability to reduce surface tension under dynamic conditions is of great importance in applications where high surface creation rates are used, i.e., spin coating, rolling, spray coating, and the like. Dynamic surface tension provides a measure of the ability of the solution to lower surface tension and provide wetting under high speed application conditions. Further, in certain applications such as during spray application, it is advantageous that the surfactant reduces the surface tension of the formulation in a manner that minimizes the problem of bubble generation and foaming. Foaming and bubble generation may lead to defects. Consequently, considerable efforts have been made in the electronics and other industries towards solving the foaming problem.

In the electronics industry, defects are a major limiting factor for production yield and device function, particularly when the device sizes are reduced and wafer sizes are enlarged to 300 mm. The term "defects", as used herein, relates to defects that may reduce the yield, or cause the loss, of the semiconductor device such as the collapse of the photoresist pattern on the substrate surface; roughness in the photoresist lines such as "line width roughness" or "line edge roughness", particulates introduced onto the substrate resulting from processing such as lithography, etching, stripping, and chemical mechanical planarization (CMP) residues; particulates either indigenous to or resulting from manufacturing processes; pattern imperfections such as closed or partially open or blocked contacts or vias; line width variations; and defects resulting from poor adhesion of the resist to the substrate surface.

The drive to reduce defects—thereby improving yield—presents new challenges to the manufacturing steps within the production of the semiconductor device, namely, the lithography, etching, stripping, and chemical-mechanical planarization (CMP) processes. The lithography process generally involves coating a substrate with a positive or negative photoresist, exposing the substrate to a radiation source to provide an image, and developing the substrate to form a patterned photoresist layer on the substrate. This patterned layer acts as a mask for subsequent substrate patterning processes such as etching, doping, and/or coating with metals, other semiconductor materials, or insulating materials. The etching process generally involves removing the surface of the substrate that is not protected by the patterned photoresist using a chemical or plasma etchant thereby exposing the underlying surface for further processing. The stripping process generally involves removing the cross-linked, photoresist pattern from the substrate via wet stripping or oxygen plasma ashing. The CMP process generally involves polishing the surface of the substrate to maintain flatness during processing. All of the aforementioned processes typically employ a rinse step to remove any particulate material that is generated from, or is a by-product of, these processes.

Traditional nonionic surfactants such as alkylphenol or alcohol ethoxylates, and ethylene oxide (EO)/propylene oxide (PO) copolymers have excellent equilibrium surface tension performance but are generally characterized as having poor dynamic surface tension reduction. In contrast, certain anionic surfactants such as sodium dialkyl sulfosuccinates can provide good dynamic results, but these are very foamy and impart water sensitivity to the finished coating.

Surfactants based on acetylenic glycols such as 2,4,7,9-tetramethyl-5-decyne-4,7-diol (1) and its ethoxylates (2) are known for their good balance of equilibrium and dynamic surface-tension-reducing capabilities with few of the negative features of traditional nonionic and anionic surfactants.

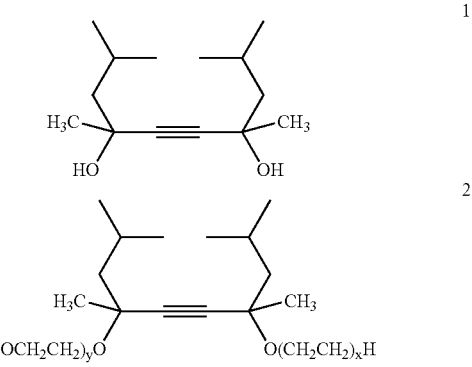

For many applications it would be desirable to produce acetylenic diol derivatives which have alternative properties. For example, in applications in which excellent dynamic performance is required, it is often desirable to have a surfactant which has higher critical aggregation concentration (solubility limit or critical micelle concentration) because higher bulk surfactant concentrations lead to a higher diffusive flux of surfactant to newly created surface, and consequently lower dynamic surface tension. Traditionally, acetylenic diol surfactants with higher water solubility have been obtained by reaction of the parent with ethylene oxide; greater degrees of ethoxylation provide greater water solubility. Unfortunately, increasing the level of ethoxylation also introduces a tendency to foam, introducing inefficiencies during formulation, defects during application, and process issues in other applications.

Low dynamic surface tension is of great importance in the application of waterborne coatings. In an article, Schwartz, J. "The Importance of Low Dynamic Surface Tension in Waterborne Coatings", Journal of Coatings Technology, September 1992, there is a discussion of surface tension properties in waterborne coatings and a discussion of dynamic surface tension in such coatings. Equilibrium and dynamic surface tension were evaluated for several surface active agents. It is pointed out that low dynamic surface tension is an important factor in achieving superior film formation in waterborne coatings. Dynamic coating application methods require surfactants with low dynamic surface tensions in order to prevent defects such as retraction, craters, and foam.

In applications which require good dynamic performance and low foaming, acetylenic glycol-based surfactants have become industry standards. The following patents and articles describe various acetylenic alcohols and their ethoxylates as surface active agents:

U.S. Pat. No. 3,268,593 and Leeds, et al, *I&EC Product Research and Development* 1965, 4, 237, disclose ethylene oxide adducts of tertiary acetylenic alcohols represented by the structural formula

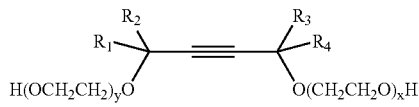

wherein $R_1$ and $R_4$ are alkyl radicals having from 3-10 carbon atoms and $R_2$ and $R_3$ are methyl or ethyl and x and y have a sum in the range of 3 to 60, inclusive. Specific ethylene oxide adducts include the ethylene oxide adducts of 3-methyl-1-nonyn-3-ol, 7,10-dimethyl-8-hexadecyne-7,10-diol; 2,4,7,9-tetramethyl-5-decyne-4,7-diol and 4,7-dimethyl-5-decyne-4,7-diol. Preferably, the ethylene oxide adducts range from 3 to 20 units. Also disclosed is a process for the manufacture of materials of this type using trialkylamine catalysts.

U.S. Pat. No. 4,117,249 discloses 3 to 30 mole ethylene oxide (EO) adducts of acetylenic glycols represented by the structural formula

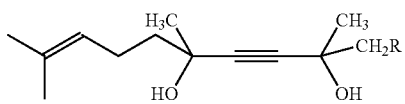

wherein R is hydrogen or an alkenyl radical. The acetylenic glycols are acknowledged as having utility as surface active agents, dispersants, antifoaming nonionic agents, and viscosity stabilizers.

U.S. Pat. No. 5,650,543 discloses ethoxylated acetylenic glycols of the form

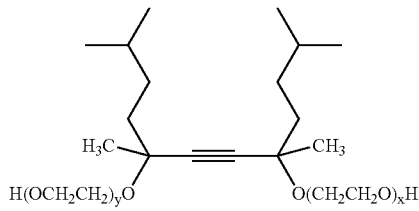

where x and y are integers and the sum is from 2-50. These surfactants are notable because they impart an ability to formulate coating and ink compositions capable of high speed application.

JP 2636954 B2 discloses propylene oxide adducts of formula

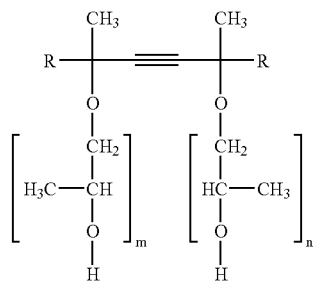

where R=C1-8 alkyl; m+n=integer 1 to 100. These compounds are prepared by reacting acetylenic glycols and propylene oxide in the presence of Lewis acid catalysts such as $BF_3$. It is stated that amine catalysts are inactive for the addition of propylene oxide to acetylenic diols. The propylene oxide adducts are said to be useful as wettability improvers for antirust oil, antifoamers, spreaders for pesticides, and wetting agents for adhesives. They are effective in improving wettability of oils and have improved antifoaming ability.

JP 2621662 B2 describes dye or developing agent dispersions for thermal recording paper containing propylene oxide (PO) derivatives of an acetylenic diol of the form

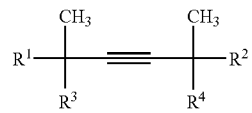

where R1 and R2 are —$CH_3$, —$C_2H_5$, —$C_4H_9$; R3 and R4 are —($OC_3H_4$)mOH, or —OH where m is an integer 1-10.

JP 04071894 A describes coating solutions containing a dispersion of a colorless electron donating dye precursor and a dispersion of developer. At least one of them contains at least one type of wax having a melting point of at least 60° C. and at least one EO or PO derivative of an acetylenic diol of the formula

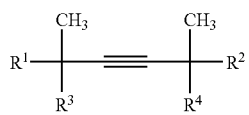

where R1 and R4 each represent methyl, ethyl, propyl, or butyl and R2 and R3 are each —$(OC_2H_5)nOH$, or —$(OC_3H_6)_nOH$ (n is 1-10), or OH, mixed and dispersed.

JP 2569377 B2 discloses a recording material containing dispersions of a substantially colorless electron donating dye precursor and a developer. When at least one of these dispersions is prepared, at least one of the compounds

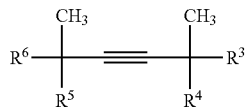

where $R^3$ and $R^6$=methyl, ethyl, propyl or butyl; and $R^4$ and $R^5$=—$(OC_2H_4)_mOH$, —$(OC_3H_6)_mOH$ (where m=an integer of 1-10) or —OH is added.

JP 09150577 A discloses a heat sensitive recording medium which contains in the heat sensitive layer a leuco dye and 0.1-1.0 wt % of an ethoxylate or propoxylate of an acetylenic glycol of the form

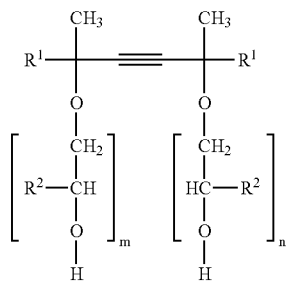

where $R^1$=methyl, ethyl, propyl or butyl; $R^2$=hydrogen or methyl; and n and m=1-10.

JP 04091168 A discloses silica which has been surface treated with compounds of the form

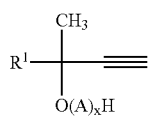 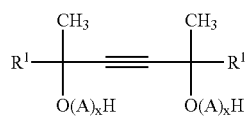

where R1=1-8C alkyl, A=2-3C alkylene glycol residue, R1 and A in a molecule may be the same or different, x and y=each an integer of 0-25.

JP 06279081 A describes a manufacturing process for a cement mortar-concrete hardening material to which 0.5-10 wt. % an acetylenic alcohol or diol alkoxylate is added together with fluorine group surfactants and/or silicon group surfactants. The acetylenic material can be expressed by the formula

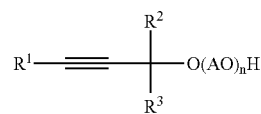

where R1=H or —C(R2)(R3)(O(AO)nH); R2 and R3=1-8 C alkyl radicals, A=2-3 C alkylene radicals and n=0-30.

JP 03063187 A discloses the use of acetylenic glycol ethylene oxide and/or propylene oxide addition products in concentrated aqueous fountain solution compositions for offset printing. In one example, the 8 to 12 mole ethylene oxide/1 to 2 mole propylene oxide adduct of 3,5-dimethyl-4-octyne-3,5-diol is used in a fountain solution. Other examples illustrate the use of only ethylene oxide derivatives of acetylenic diols.

Although acetylenic diol derivatives containing both ethylene oxide (EO) and propylene oxide (PO) have been taught as a general class of materials, usually as potential extensions of work which had been performed with ethylene oxide derivatives, no actual examples of an acetylenic diol EO/PO derivative based upon 2,4,7,9-tetramethyl-5-decyne-4,7-diol or 2,5,8,11-tetramethyl-6-dodecyne-5,8-diol have been prepared and evaluated. There are no disclosures of any process which could be used to prepare materials of this type.

BRIEF SUMMARY OF THE INVENTION

This invention provides acetylenic diol ethylene oxide/propylene oxide adducts or alkoxylated acetylenic diols which act as surfactants for water based compositions of the following structure A:

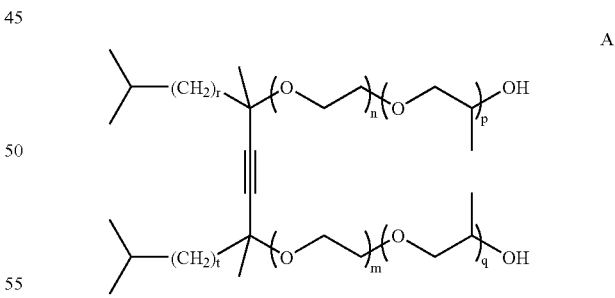

where r and t are, preferably the same, 1 or 2, (n+m) is 1 to 30 and (p+q) is 1 to 30. The EO and PO units may be distributed along the alkylene oxide chain in blocks of EOs and POs or randomly.

The present invention also describes process solutions, which are aqueous-based, non-aqueous based, and combinations thereof, that contain alkoxylated acetylenic diols having the following formulas:

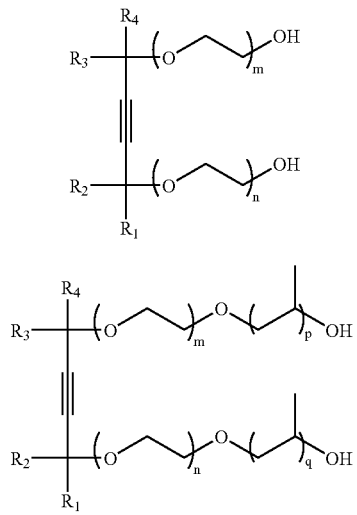

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20.

This invention also relates to processes for the manufacture of certain alkoxylated acetylenic diols.

Another embodiment of the invention affords water-based or aqueous-based compositions containing an organic or inorganic compound, particularly aqueous organic coating, ink, and agricultural compositions, having reduced equilibrium and dynamic surface tension by incorporation of an effective amount of an alkoxylated acetylenic diol of the above structure.

Yet another embodiment disclosed herein are process solutions, that may be aqueous-based, non-aqueous based, or combinations thereof, which are used to treat the surface of a substrate and a method for using same prior to development of the substrate. In this connection, the process solutions described herein may be used to modify the character of the substrate surface from a hydrophobic surface to a substantially more hydrophilic surface, or vice versa.

A still further embodiment disclosed herein are process solutions, that may be aqueous-based, non-aqueous based, or combinations thereof, which are used to treat a substrate after pattern and development of the substrate.

It is desirable that an aqueous solution of the alkoxylated acetylenic diol demonstrates a dynamic surface tension of less than 45 dynes/cm or less than 35 dynes/cm at a concentration of $\leq 0.5$ wt % in water at 23° C. and 1 bubble/second according to the maximum-bubble pressure method. The maximum-bubble-pressure method of measuring surface tension is described in *Langmuir* 1986, 2, 428-432, which is incorporated by reference.

Also provided is a method for lowering the equilibrium and dynamic surface tension of aqueous compositions or process solutions by the incorporation of these alkoxylated acetylenic diol compounds.

Also provided is a method for applying a water-based inorganic or organic compound-containing composition to a surface to partially or fully coat the surface with the water-based composition, the composition containing an effective amount of at least one alkoxylated acetylenic diol surfactants having the formula I, II, A, or B for reducing the dynamic surface tension of the water-based composition. In certain embodiments, the effective amount of alkoxylated acetylenic diol surfactant that is added may range, from about 10 to about 500,000 ppm, or from about 10 to about 10,000 ppm, or about 10 to about 5,000 ppm, or from about 10 to about 1,000 ppm. Because of their excellent surfactant properties and the ability to control foam, these materials are likely to find use in many applications in which reduction in dynamic and equilibrium surface tension and low foam are important.

DETAILED DESCRIPTION OF THE INVENTION

Disclosed herein are process solutions comprising at least one alkoxylated acetylenic diol surfactants in an aqueous-based, non-aqueous based, or combination thereof carrier medium. The term "alkoxylated acetylenic diol", as used herein, describes at least one acetylenic diol ethylene oxide/propylene oxide adducts having the formula I, II, A, or B. In one aspect, this invention relates to alkoxylated acetylenic diols having the following formulas I or II and their use, for example, in aqueous and/or non-aqueous process solutions:

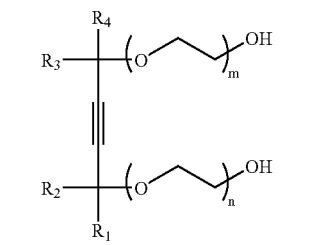

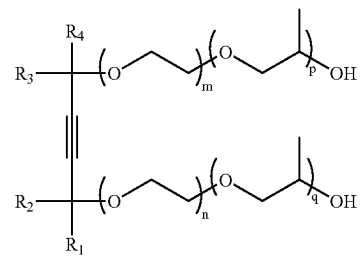

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20. The surfactants are commercially available from Air Products and Chemicals, Inc. of Allentown, Pa., the assignee of the present invention, under the trade names SURFYNOL® and DYNOL®.

In formulas I and II, the alkylene oxide moieties represented by $(OC_2H_4)$ are the (n+m) polymerized ethylene oxide (EO) molar units and the moieties represented by $(OC_3H_6)$ are the (p+q) polymerized propylene oxide (PO) molar units. The value of (n+m) may range from 0 to 30, preferably from 1.3 to 15, and more preferably from 1.3 to 10. The value of (p+q) may range from 0 to 30, preferably from 1 to 10, and more preferably from 1 to 2.

A specific example of an alkoxylated acetylenic diol of formula II is a compound having the following formula A:

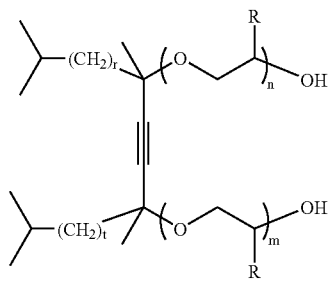

A where (n+m) and (p+q) each can range from 1 to 30. It is preferred that (n+m) be 1.3 to 15 and most preferably 1.3 to 10. It is preferred that (p+q) be 1 to 10, more preferred 1-3 and most preferred 2. In Formula A, r and t are 1 or 2, especially r=t, i.e. the acetylenic diol portion of the molecule is 2,4,7,9-tetramethyl-5-decyne-4,7-diol or 2,5,8,11-tetramethyl-6-dodecyne-5,8-diol.

In formula A, the alkylene oxide moieties represented by ($OC_2H_4$) are the (n+m) polymerized ethylene oxide (EO) units and those represented by ($OC_3H_6$) are the (p+q) polymerized propylene oxide (PO) units. Products in which the EO and PO units are each segregated together are referred to as "block" alkoxylate derivatives. The products in which the EO and PO units are randomly distributed along the polymer chain are referred to as "random" alkoxylate derivatives. Random derivatives can be represented by formula B, which is a particular example of a compound having the above formula I:

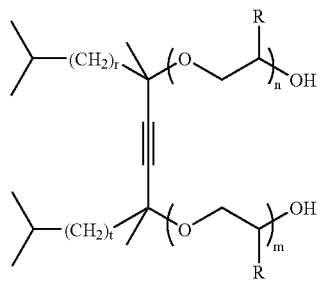

B where R is hydrogen or methyl and (n+m)=2-60 with the proviso that the compound contain at least one ethylene oxide and at least one propylene oxide unit; and r and t are 1 or 2, especially r=t.

The block compositions of structure A can be prepared by reaction of 2,4,7,9-tetramethyl-5-decyne-4,7-diol or 2,5,8,11-tetramethyl-6-dodecyne-5,8-diol with the requisite quantities of ethylene oxide followed by propylene oxide in the presence of a suitable catalyst. Suitable catalysts include trialkylamines and Lewis acids, particularly $BF_3$. Alternatively, the compositions may be prepared by reaction of a pre-formed acetylenic diol ethoxylate with propylene oxide in the presence of an appropriate catalyst. In this case of a pre-formed acetylenic diol ethoxylate, it may be possible to use KOH or other alkali catalysts to effect the reaction with propylene oxide, provided the amount of ethylene oxide which has been added is sufficient to cover essentially all of the tertiary alcohol functionality.

The acetylenic diol alkoxylate surfactants described herein may be prepared in a number of ways. The preferred process for making the acetylenic diol alkoxylates uses $BF_3$ or trialkylamine catalysts. The use of $BF_3$ allows the rapid preparation of derivatives containing relatively large quantities of propylene oxide. However, compositions prepared with trialkylamine catalysts, especially trimethylamine, are preferred for several reasons. They can be prepared using a process very similar to that used for manufacture of acetylenic diol ethoxylates without significant byproduct chemistry. In particular, trialkylamine catalysts allow for the preparation of 2 mole propylene oxide capped derivatives in high selectivity using a highly efficient, one pot process.

With respect to the processes for the preparation of acetylenic diol EO/PO adducts, the tertiary acetylenic diol starting materials can be prepared in various known manners such as those described in U.S. Pat. No. 2,250,445; U.S. Pat. No. 2,106,180 and U.S. Pat. No. 2,163,720, which are incorporated by reference. The acetylenic diol starting material may contain from 8 to 26 carbons. It is preferred that the acetylenic diol starting material contain 14 to 16 carbons, and it is most particularly preferred that it be 2,4,7,9-tetramethyl-5-decyne-4,7-diol or 2,5,8,11-tetramethyl-6-dodecyne-5,8-diol.

Various basic catalysts can be used to promote the reaction between the alkylene oxide and the acetylenic tertiary glycols in which the hydroxyl groups are attached to a carbon atom in a position alpha to the acetylenic bonds according to this invention. Tertiary aliphatic amines, namely trialkylamines such as trimethylamine, triethylamine, tripropylamine, dimethylethylamine, diethylmethylamine and the like, are particularly advantageous catalysts for the reaction. Such tertiary aliphatic amines catalyze the addition reaction at a rapid rate at moderately low temperatures and pressures without inducing cleavage of the acetylenic glycol. Trimethylamine is preferred because of its high catalytic activity and longevity in the reaction.

As is known in the art, the use of strongly basic catalysts such as sodium hydroxide, especially at high temperatures of about 150° C., induces cleavage of the acetylenic tertiary glycols and for this reason should be avoided, unless of course, sufficient ethylene oxide has been added to prevent substantial decomposition of tertiary acetylenic alcohol functionality. Once the tertiary hydroxyl groups of the acetylenic glycol have reacted with ethylene oxide, the resultant adduct exhibits the marked stability of an ether. So stable are the adducts that they can be heated with concentrated base such as sodium hydroxide at elevated temperatures, while comparable treatment of the initial acetylenic glycol is accompanied by extensive degradation. Consequently, strongly basic catalysts, such as the alkali metal hydroxides, can be used to increase the polyalkylene oxide chain length once the initial adducts have been formed and protected against decomposition. It is anticipated that alkali metal hydroxides could also be used to promote the addition of propylene oxide to initial EO or PO adducts with sufficiently low quantities of residual tertiary acetylenic alcohol functionality.

The trialkylamine-catalyzed addition reaction may be performed at either atmospheric (15 psig; 1 bar) or moderate to low superatmospheric pressures (30-300 psig; 2-20 bar). The use of moderate to low superatmospheric pressures is preferred since it obviates the necessity of recycling unreacted ethylene oxide and propylene oxide, and generally proceeds at faster rates than additions carried out at atmospheric pressures. The effect of pressure on rate is particularly important in the reaction with propylene oxide, and it is therefore preferred that reactions be performed at pressures in excess of 30 psig (2 bar). It is particularly preferred that the process be carried out at a pressure greater than 60 psig (4 bar). Another benefit of performing the reaction under pressure is that such reactions may be accomplished with ordinary efficient agitation, while reactions conducted at atmospheric pressure often work best when a dispersion type agitator is used. While the reaction can be carried out at lower pressure, reaction rates, and therefore reactor productivity, suffer. Performing the reaction at pressures much in excess of about 300 psig (20 bar) would likely have only marginal benefit, and would increase the cost of equipment required for manufacture. It is preferred to operate at 100 psig (6.7 bar).

The temperature at which the reaction is run for trialkylamine catalyzed reactions will depend upon the particular system and the catalyst concentration. Generally, at higher catalyst concentrations, the reactions can be run at lower temperatures and pressures. Reaction temperatures should be high enough to permit the reaction to proceed at a reasonable rate, but low enough to prevent decomposition of the reagents and products. Temperatures in the range of 40-150° C. are suitable, 50-120° C. preferred, and 70-90° C. particularly preferred.

In the trialkylamine catalyzed process in which propylene oxide is added to an acetylenic diol EO adduct, the reaction stops at a PO end cap on each chain, i.e., the obtained product is an acetylenic diol EO/PO adduct containing two PO end caps, p and q each being 1 in Formula A. When a mixture of EO and PO is added to an acetylenic diol or diol EO adduct, the trialkylamine catalyzed process affords an adduct having random EO and PO units, in the latter case extending beyond the original EO block.

To prepare the EO/PO adducts of the invention, the acetylenic glycol is liquefied by melting and the catalyst is added with stirring. Ethylene oxide and/or propylene oxide are added as liquids with stirring and the reaction is concluded when the desired polyalkylene oxide chain length is reached as determined by gel permeation chromatography (GPC), high performance liquid chromatography (HPLC), nuclear magnetic resonance (NMR), cloud point (ASTM D2024-65) or water titration of an isopropyl alcohol solution. No solvents are necessary during the reaction, but inert solvents such as aromatic hydrocarbons (benzene and toluene) and ethers (ethyl ether) may be used to facilitate handling. In some instances it may be convenient to use a low mole ethoxylated acetylenic diol, since these products are liquids and are therefore easy to handle.

In reactions catalyzed by Lewis acids, the reaction conditions will be determined by the identity and concentration of the catalyst. Examples of Lewis acid catalysts include $BCl_3$, $AlCl_3$, $TiCl_4$, $BF_3$, $SnCl_4$, $ZnCl_2$ and the like. The preferred Lewis acid catalyst is $BF_3$. In $BF_3$ catalyzed reactions, temperature control during the initial stages of the reaction is critical, since too high a temperature will result in dehydration of the acetylenic diol. It is preferred that the temperature be maintained below 80° C., preferably below 60° C., and most preferably below 50° C. The reaction pressure can range from atmospheric to low to moderate superatmospheric pressure, i.e., from 15 to 300 psig (1 to 20 bar). Because of the high activity of $BF_3$, good results can be obtained at more moderate pressures of about 1 bar than for those reactions performed using trialkylamine catalysts.

In adding liquid alkylene oxide(s) to the acetylenic glycol and the catalyst, care should be taken to avoid the presence of an excess of alkylene oxide(s) in the reaction mixture since the reaction is very exothermic and could prove to be very hazardous. The danger of an uncontrollable reaction can be avoided by adding the alkylene oxide(s) in a manner and at a rate such that the alkylene oxide(s) are reacted essentially as rapidly as they are introduced into the reaction mixture. The formation of a flammable mixture in the headspace is best avoided by pressuring the reactor headspace to a sufficient pressure with an inert gas such as nitrogen such that the alkylene oxide(s) remains below its lower explosive limit (LEL).

In the both the Lewis acid catalyzed and the trialkylamine catalyzed processes, the catalysts may be used at 0.001 to 10 wt %, preferably 0.01 to 5 wt %, and most preferably 0.1 to 1 wt %, based on total final reactant mass. In both cases, because deactivation may occur during the alkoxylation, it may be necessary to add additional catalyst to complete the reaction, particularly if large amounts of EO and PO are being added.

In the processes for making the randomly distributed EO/PO adducts, the EO and PO may be added to the reaction concurrently as separate charges or streams, or added as a single charge or stream comprising a mixture of EO and PO. In making block EO/PO adducts the EO and PO are added consecutively.

The process solution of the present invention may have as a carrier phase or medium an aqueous-based solvent and/or non-aqueous-based solvent. The term "aqueous" as used herein, describes a solvent or liquid dispersing medium, which comprises at least 80 weight percent, preferably 90 weight percent, and more preferably at least 95 weight percent water. The preferred aqueous-based solvent is deionized water. In embodiments wherein the process solution is aqueous-based, it is desirable that the at least one alkoxylated acetylenic diol surfactant added to the solution demonstrates a dynamic surface tension of less than 45 dynes/cm at a concentration of less than or equal to 5 weight percent in water at 23° C. and 1 bubble/second according to the maximum-bubble-pressure method of measuring surface tension described in *Langmuir* 1986, 2, 428-432, which is incorporated herein by reference in its entirety.

In embodiments where a non-aqueous solvent is used in addition to or in place of an aqueous solvent such as water, the non-aqueous solvent selected will preferably not react with the alkoxylated acetylenic diol surfactant contained therein, other additives within the process solution, or the substrate itself. Suitable solvents include, but are not limited to, hydrocarbons (e. g. pentane or hexane); halocarbons (e. g. Freon 113); ethers (e. g. ethylether ($Et_2O$), tetrahydrofuran ("THF"), ethylene glycol monomethyl ether, or 2-methoxyethyl ether (diglyme)); nitriles (e. g. $CH_3CN$); or aromatic compounds (e.g. benzotrifluoride). Still further exemplary solvents include lactates, pyruvates, and diols. These solvents include, but are not limited to, acetone, 1,4-dioxane, 1,3-dioxolane, ethyl acetate, cyclohexanone, acetone, 1-methyl-2-pyrodidianone (NMP), and methyl ethyl ketone. Other solvents, include dimethylformamide, dimethylacetamide, N-methyl pyrrolidone, ethylene carbonate, propylene carbonate, glycerol and derivatives, naphthalene and substituted versions, acetic acid anyhydride, propionic acid and propionic acid anhydride, dimethyl sulfone, benzophenone, diphenyl sulfone, phenol, m-cresol, dimethyl sulfoxide, diphenyl ether, terphenyl, and the like. Still further solvents include propylene glycol propyl ether (PGPE), methanol, ethanol, 3-heptanol, 2-methyl-1-pentanol, 5-methyl-2-hexanol, 3-hexanol, 2-heptano, 2-hexanol, 2,3-dimethyl-3-pentanol, propylene glycol methyl ether acetate (PGMEA), ethylene glycol, isopropyl alcohol (IPA), n-butyl ether, propylene glycol-n-butyl-ether (PGBE), 1butoxy-2- propanol, 2-methyl-3-pentanol, 2-methoxyethyl acetate, 2-butoxyethanol, 2-ethoxyethyl acetoacetate, 1-pentanol, and propylene glycol methyl ether. The non-aqueous solvents enumerated above may be used alone or in combination with two or more solvents.

In certain embodiments, the process solution may contain at least one non-aqueous solvent that is miscible in an aqueous solvent or is water-miscible. In these embodiments, the amount of non-aqueous solvent within the process solution may range from about 1 to about 50% by weight with the balance of the solvent within the process solution comprising an aqueous solvent. Examples of water-miscible non-aqueous solvents include methanol, ethanol, isopropyl alcohol, and THF.

The amount of at least one alkoxylated acetylenic diol surfactant having the formula I, II, A, or B that is added to the process solution is effective in reducing the equilibrium surface tension and/or dynamic surface tension of the aqueous-based, non-aqueous-based, or combination of aqueous-base or non-aqueous-based solution. An amount of the alkoxylated acetylenic diol compound that is effective to reduce the equilibrium and/or dynamic surface tension of the aqueous-based, non-aqueous-based, or combination thereof process solution is added. Naturally, the most effective amount will depend on the particular application and the solubility of the particular alkoxylated acetylenic diol selected.

In certain embodiments, the effective amount of alkoxylated acetylenic diol surfactant that is added may range, from about 10 to about 500,000 ppm, or from about 10 to about 10,000 ppm, or about 10 to about 5,000 ppm, or from about 10 to about 1,000 ppm. In one particular embodiment, the process solution contains a carrier medium which is water, a water-miscible solvent, and an amount of alkoxylated acetylenic diol surfactant sufficient to reduce the dynamic surface tension of the solution. In this particular embodiment, other additives or ingredients may be added provided that they do not adversely effect, i.e., increase, the dynamic surface tension of the solution.

The process solution may optionally contain a dispersant. The amount of dispersant that is added to the process solution ranges from about 10 to about 10,000 ppm, preferably about 10 to about 5,000 ppm, and more preferably from about 10 to about 1,000 ppm. The term dispersant, as used herein, describes compounds that enhance the dispersion of particles such as dust, processing residue, hydrocarbons, metal oxides, pigment or other contaminants within the process solution. Dispersants suitable for the present invention preferably have a number average molecular weight that ranges from about 10 to about 10,000.

The dispersant may be an ionic or a nonionic compound. The ionic or nonionic compound may further comprise a copolymer, an oligomer, or a surfactant, alone or in combination. The term copolymer, as used herein, relates to a polymer compound consisting of more than one polymeric compound such as block, star, or grafted copolymers. Examples of a nonionic copolymer dispersant include polymeric compounds such as the tri-block EO-PO-EO co-polymers PLURONIC® L121, L123, L31, L81, L101 and P123 (BASF, Inc.). The term oligomer, as used herein, relates to a polymer compound consisting of only a few monomer units. Examples of ionic oligomer dispersants include SMA® 1440 and 2625 oligomers (Elf Alfochem).

Alternatively, the dispersant may comprise a surfactant. If the dispersant comprises a surfactant, the surfactant may be ionic (i.e., anionic, cationic) or nonionic. Further examples of surfactants include silicone surfactants, poly(alkylene oxide) surfactants, and fluorochemical surfactants. Suitable non-ionic surfactants for use in the process solution include, but are not limited to, octyl and nonyl phenol ethoxylates such as TRITON® X-114, X-102, X-45, X-15 and alcohol ethoxylates such as BRIJ® 56 ($C_{16}H_{33}(OCH_2CH_2)_{10}OH$) (ICI), BRIJ® 58 ($C_{16}H_{33}(OCH_2CH_2)_{20}OH$) (ICI). Still further exemplary surfactants include alcohol (primary and secondary) ethoxylates, amine ethoxylates, glucosides, glucamides, polyethylene glycols, poly(ethylene glycol-co-propylene glycol), or other surfactants provided in the reference *McCutcheon's Emulsifiers and Detergents*, North American Edition for the Year 2000 published by Manufacturers Confectioners Publishing Co. of Glen Rock, N.J.

Various other additives may be optionally added to the process solution depending upon the application. These additives may include, but are not limited to, stabilizers, dissolving aids, colorants, wetting agents, antifoamers, buffering agents, and other additional surfactants. Generally, unless otherwise stated, the amount of each of these additives would be about 0.0001 to 1 percent by weight, more preferably 0.0001 to 0.1 percent by weight, based upon the total weight of the process solution. In embodiments where one or more additional surfactants are added to the process solution, the surfactant may be any of the surfactants disclosed herein or provided in the reference *McCutcheon's Emulsifiers and Detergents*.

In certain embodiments, the process solution of the present invention may be used as a non-aqueous photoresist. In this connection, the process solution preferably comprises from 60 to 90, preferably from 70 to 90 weight percent non-aqueous solvent; from 5 to 40 weight percent, preferably from 10 to 20 weight percent resist polymer; from 0.5 to about 2 weight percent of a photoactive compound; 10 to 10,000 ppm of the alkoxylated acetylenic diol surfactant; and less than 1 weight percent of other additives such as polymerization inhibitors, dyes, plasticizers, viscosity control agents, and the like. The viscosity of the photoresist can be adjusted by varying the polymer to solvent ratio, thus allowing resists to be formulated for coating a variety of film thickness. Examples of suitable non-aqueous solvents within the photoresist process solution include any of the solvents contained herein. Non-limiting examples of a resist polymer include novolac resin or polyvinyl phenol copolymer. Non-limiting examples of a photoactive compounds include diazonaphthoquinone or photo acid generators (PAG).

The process solution of the present invention may also be used as a non-aqueous edge bead remover. Edge bead removers may be applied prior to baking the patterned photoresist layer to cross-link the polymer therein or prior to lithography. In this embodiment, the process solution preferably comprises from 99 to 100 weight percent non-aqueous solvent; 10 to 10,000 ppm of an alkoxylated acetylenic diol surfactant; and less than 1 weight percent of other additives. Examples of suitable non-aqueous solvents within the edge bead remover process solution include any of the solvents contained herein. In certain preferred embodiments, the solvent may be PGMEA, ethyl lactate, or anisole.

The process solution of the present invention may also be used as an anti-reflective coating for the top or bottom surface of the substrate. In this embodiment, the process solution preferably comprises from 60 to 99 weight percent non-aqueous solvent; from 1 to 40 weight percent, preferably 1 to 20 weight percent of a polymer; from 10 to 10,000 ppm of alkoxylated acetylenic diol surfactant; and less than 1 weight percent of other additives such as crosslinker(s), surfactant(s), dye compounds, and the like. In general, the solids content of the process solution may vary from about 0.5 to about 40, preferably 0.5 to about 20, and more preferably 2 to 10 weight percent of the total weight of the process solution. Examples of suitable non-aqueous solvents within the ARC process solution include any of the solvents contained herein. In certain preferred embodiments, the solvent may be PGMEA or ethyl lactate. Examples of suitable polymers within the ARC process solution include, but are not limited to, acrylate polymers or phenyl-containing polymers such as those disclosed in U.S. Pat. No. 6,410,209 and spin-on-glass materials such as the methylsiloxane, methylsilsesquioxane, and silicate polymers such as those disclosed in U.S. Pat. Nos. 6,268,457 and 6,365,765.

The process solution of the present invention may be used in wafer cleaning methods, such as RCA-type cleaning, performed after the development step. In this embodiment, the substrate may be treated with the process solution after the stripping, CMP, ash cleaning, and/or etching steps have been completed. In one embodiment of the present invention, the process solution comprises a base such as an amine and/or ammonium hydroxide, alkylammonium hydroxide; an oxidizing agent such as $H_2O_2$; optionally a chelating agent; from 10 to 10,000 ppm of alkoxylated acetylenic diol surfactant; in an aqueous solvent or water. Some non-limiting examples of chelating agents are the following organic acids and its isomers and salts: (ethylenedinitrilo) tetraacetic acid (EDTA), butylenediaminetetraacetic acid, cyclohexane-1,2-diaminetetraacetic acid (CyDTA), diethylenetriaminepentaacetic acid (DETPA), ethylenediaminetetrapropionic acid, ethylenediaminetetrapropionic acid, (hydroxyethyl)ethylenediaminetriacetic acid (HEDTA), N,N,N',N'-ethylenediaminetetra(methylenephosphonic) acid (EDTMP), citric acid, tartaric acid, phtalic acid, gluconic acid, saccharic acid, cathechol, gallic acid, pyrogallol, propyl gallate, and cysteine. In an alternative embodiment, the process solution comprises dilute HF; from 10 to 10,000 ppm of alkoxylated acetylenic diol surfactant; and water. In a further embodiment, the process solution comprises an acid such as sulfuric acid or HCl and an oxidizing agent such as $H_2O_2$ wherein the ratio of the acid to the oxidizing agent is 1:1; optionally a chelating agent; from 10 to 10,000 ppm of at least one formula I through X surfactant; and an aqueous solvent or water. In another embodiment, the process solution comprises an aqueous solvent such as electrolytic ionized water and from 10 to 10,000 ppm of alkoxylated acetylenic diol surfactant. In yet another embodiment, the process solution comprises UV/ozone; from 10 to 10,000 ppm of alkoxylated acetylenic diol surfactant; and water. For wafer cleaning applications, the process solution may be used for either megasonic or regular cleaning such as spray application.

In one embodiment of the present invention, the process solution comprises from 0.01 to 10% by weight of at least one base; from 0.1 to 10% by weight of at least one oxidizing agent; from 0 to 5% by weight of at least one chelating agent; from 10 to 500,000 ppm of alkoxylated acetylenic diol surfactant; and the balance solvent. In an alternative embodiment, the process solution comprises from 0.01 to 10% by weight dilute HF; from 10 to 500,000 ppm of alkoxylated acetylenic diol surfactant; and the balance solvent. In a further embodiment, the process solution comprises an acid such as citric acid or phosphoric acid and an oxidizing agent such as $H_2O_2$ wherein the amount of acid and oxygen contained therein ranges from 0.01 to 20% by weight; optionally from 10 ppm to 10% by weight of at least one chelating agent; from 10 to 500,000 ppm of alkoxylated acetylenic diol surfactant; and the balance solvent. In another embodiment, the process solution comprises an aqueous-based solvent such as electrolytic ionized water and from 10 to 500,000 ppm of alkoxylated acetylenic diol surfactant.

The process solution of the present invention may be prepared by mixing the alkoxylated acetylenic diol surfactant with an aqueous and/or non-aqueous solvents and any additional ingredients or additives. In certain embodiments, the mixing may be done at a temperature range of about 40 to 60° C. to affect dissolution of the ingredients contained therein. The resulting process solution may optionally be filtered to remove any undissolved particles that could potentially harm the substrate.

The alkoxylated acetylenic diols are useful for the reduction of equilibrium and dynamic surface tension in a variety of processes related to the manufacture of a semiconductor device such as for example, lithography process solutions, i.e., rinse, resist, edge bead remover, and anti-reflective coating (ARC) solutions; post-etching process solutions, i.e., sidewall film, stripper, post-strip/ash rinse solutions; wafer cleaning process solutions, i.e., additives to RCA or other standard cleaning solutions, super-critical $CO_2$ cleaning solutions; and post-CMP process solutions. The addition of these surfactants to the process solution may allow for the reduction of equilibrium and dynamic surface tension while minimizing foaming. In certain embodiments, the process solutions described herein may also be suitable for pretreatment of a substrate surface prior to lithographic processing. In other embodiments, the process solution described herein may be employed as a lithography rinse solution in addition to, or in place of, a deionized water rinse.

The process solution is preferably used to treat the surface of a substrate before, during, and/or after the development step. Suitable substrates include, but are not limited to, materials such as gallium arsenide ("GaAs"), silicon, tantalum, copper, ceramics, aluminum/copper alloys, polyimides, and compositions containing silicon such as crystalline silicon, polysilicon, amorphous silicon, epitaxial silicon, silicon dioxide ("$SiO_2$"), silicon nitride, doped silicon dioxide, and the like. Further exemplary substrates include silicon, aluminum, or polymeric resins.

The surfactant within the process solution may allow for the reduction of equilibrium and dynamic surface tension while minimizing foaming. The substrate may be treated with the process solution after the stripping, CMP, ash cleaning, and/or etching steps have been completed. The term "post-CMP processed" describes a substrate that has been subjected to one or more chemical mechanical planarization steps or has at least a portion of its surface planarized. In one embodiment of the present invention, the process solution, when employed as a post-CMP rinse, may also prevent the formation of "water mark" defects on the substrate surface. In this connection, a substrate having a surface containing a low dielectric constant material may be treated with the process solution of the present invention before transferring the substrate within multiple cleaning modules during the post-CMP cleaning steps. The treatment with the process solution allows the hydrophobic low dielectric constant surface to remain "wet" during the transferring process and consequently reduces "water-mark" type defects.

In one aspect of the invention certain alkoxylated acetylenic diols of the above formula display excellent ability to reduce equilibrium and dynamic surface tension while producing substantially no foam.

The alkoxylated acetylenic diols are suitable for use in an aqueous composition comprising in water an inorganic compound which is a mineral ore or a pigment or an organic compound which is a pigment, a polymerizable monomer, such as addition, condensation and vinyl monomers, an oligomeric resin, a polymeric resin, a macromolecule such as gum arabic or carboxymethyl cellulose, a detergent, a caustic cleaning agent, a herbicide, especially a herbicide for chlorophyll-containing plants, an insecticide, or a plant growth modifying agent.

In the following water-based organic coating, ink, fountain solution and agricultural compositions containing an alkoxylated acetylenic diol according to the invention, the other listed components of such compositions are those materials well known to the workers in the relevant art.

A typical water-based protective or decorative organic coating composition to which the alkoxylated acetylenic diol surfactants of the invention may be added would comprise the following components in an aqueous medium at 30 to 80 wt % ingredients:

| Typical Water-Based Organic Coating Composition |
| --- |
| 0 to 50 wt % Pigment Dispersant/Grind Resin |
| 0 to 80 wt % Coloring Pigments/Extender Pigments/Anti-Corrosive Pigments/Other Pigment Types |
| 5 to 99.9 wt % Water-Borne/Water-Dispersible/Water-Soluble Resins |
| 0 to 30 wt % Slip Additives/Antimicrobials/Processing Aids/Defoamers |
| 0 to 50 wt % Coalescing or Other Solvents |
| 0.01 to 10 wt % Surfactant/Wetting Agent/Flow and Leveling Agents |
| 0.01 to 5 wt % Alkoxylated Acetylenic Diol Surfactant |

A typical water-based ink composition to which the alkoxylated acetylenic diol surfactants of the invention may be added would comprise the following components in an aqueous medium at 20 to 60 wt % ingredients:

| Typical Water-Based Ink Composition |
| --- |
| 1 to 50 wt % Pigment |
| 0 to 50 wt % Pigment Dispersant/Grind Resin |
| 0 to 50 wt % Clay base in appropriate resin solution vehicle |
| 5 to 99.9 wt % Water-Borne/Water-Dispersible/Water-Soluble Resins |
| 0 to 30 wt % Coalescing Solvents |
| 0.01 to 10 wt % Surfactant/Wetting Agent |
| 0.01 to 10 wt % Processing Aids/Defoamers/Solubilizing Agents |
| 0.01 to 5 wt % Alkoxylated Acetylenic Diol Surfactant |

A typical water-based agricultural composition to which the alkoxylated acetylenic diol surfactants of the invention may be added would comprise the following components in an aqueous medium at 0.1 to 80 wt % ingredients:

| Typical Water-Based Agricultural Composition | |
| --- | --- |
| 0.1 to 50 wt % | Insecticide, Herbicide or Plant Growth Modifying Agent |
| 0.01 to 10 wt % | Surfactant |
| 0 to 5 wt % | Dyes |
| 0 to 20 wt % | Thickeners/Stabilizers/Co-surfactants/Gel Inhibitors/Defoamers |
| 0 to 25 wt % | Antifreeze |
| 0.01 to 50 wt % | Alkoxylated Acetylenic Diol Surfactant |

A typical fountain solution composition for planographic printing to which the alkoxylated acetylenic diol surfactants of the invention may be added would comprise the following components in an aqueous medium at 30 to 70 wt % ingredients:

| Typical Fountain Solution for Planographic Printing |
| --- |
| 0.05 to 30 wt % Film formable, water soluble macromolecule |
| 1 to 75 wt % Alcohol, glycol, or polyol with 2-12 carbon atoms, water soluble or can be made to be water soluble |
| 0.01 to 60 wt % Water soluble organic acid, inorganic acid, or a salt of thereof |
| 0.01 to 50 wt % Alkoxylated Acetylenic Diol Surfactant |

EXAMPLE 1

This example illustrates that two mole propoxylates of acetylenic diol ethoxylates can be prepared with high selectivity when using trialkylariine catalysts. In this example, the preparation of the 7 mole propoxylate of Surfynol® 465 surfactant, which is the 10 mole ethoxylate of 2,4,7,9-tetramethyl-4-decyne-4,7-diol, was attempted.

A 1000 mL autoclave was charged with Surfynol® 465 surfactant (300 g, 0.45 moles) and dimethylethylamine (53.7 g, 0.73 moles). The reactor was sealed, purged free of air with three nitrogen pressure-vent cycles, then pressured to 100 psig (6.7 bar) with nitrogen and heated to 120° C. Propylene oxide (183 g, 3.15 moles) was added over a period of 70 minutes by means of a syringe pump. At the completion of the addition, the reaction mixture was heated for an additional 12 hr at 120° C. The reactor contents were cooled and discharged. The product was heated under vacuum to remove volatiles (unreacted PO and catalyst); 68 g of material were removed.

Matrix assisted laser desorption/ionization mass spectrometry (MALD/I) indicated that almost all the individual oligomers in the product possessed one or two propylene oxide residues with only very small amounts of product containing three or more PO units. The fate of a substantial amount of the propylene oxide appeared to be formation of dimethylamino-terminated polypropyleneoxide.

These results are consistent with relatively facile reaction of primary hydroxyl with propylene oxide, but only very sluggish reaction of propylene oxide terminated chains. It appears that after EO-terminated chains react with one propylene oxide, chain growth essentially stops. Since there are approximately two EO chains for each starting acetylenic diol, high selectivity to the two mole propoxylate results. In this environment, decomposition of the catalyst to form dimethylamino-terminated polypropylene oxide is the predominant reaction.

It would not be anticipated based on the teachings of JP 2636954 B2 that trialkylamine catalysts would have any efficacy for promoting the reaction of propylene oxide. It would also not be anticipated that high selectivity to the two mole propoxylates of an acetylenic diol could be achieved.

EXAMPLES 2-5

Example 3 illustrates the preparation of the 3.5 mole ethoxylate of 2,4,7,9-tetramethyl-5-decyne-4,7-diol capped with 2 moles of propylene oxide using trimethylamine catalyst and a preformed ethoxylate. The 3.5 mole ethoxylate of 2,4,7,9-tetramethyl-5-decyne-4,7-diol is commercially available from Air Products and Chemicals, Inc. and is marketed as Surfynol® 440 surfactant.

A 1000 mL autoclave was charged with Surfynol® 440 surfactant (400 g, 1.05 moles) which had previously been dried by heating under nitrogen. The reactor was sealed and pressure checked, the air was removed with three nitrogen pressure-vent cycles, and trimethylamine (2.7 g, 0.5 wt % of final reaction mass) was added by means of a gas tight syringe. The reactor was pressured to 100 psig (6.7 bar) with nitrogen and heated to 100° C. whereupon propylene oxide (122 g, 147 mL, 2.10 moles) was added at a rate of 1.0 mL/min by means of a syringe pump. At the completion of the addition, the reactor contents were stirred at 100° C. for 14.5 hours. The reactor was cooled and the contents were discharged into a round bottomed flask and heated under vacuum (0.25 torr) at ambient temperature (ca. 23° C.) for 16 hours to remove the trimethylamine catalyst. The product was characterized by nuclear magnetic resonance (NMR) spectrometry. The data are summarized in Table 1 which shows acetylenic diol compositions prepared using trimethylamine catalysis.

Other ethylene oxide/propylene oxide derivatives of 2,4,7,9-tetramethyl-5-decyne-4,7-diol (Examples 2, 4 and 5) were prepared in a similar manner. The compositions are also summarized in Table 1.

Since JP 2636954 B2 states that amines are inactive for the addition of propylene oxide, it would not be anticipated that trimethylamine would be an effective catalyst for the preparation of an EO/PO derivative of 2,4,7,9-tetramethyl-5-decyne-4,7-diol.

TABLE 1

| | Theoretical | | Determined by NMR | |
|---|---|---|---|---|
| Example | EO Moles | PO Moles | EO Moles | PO Moles |
| 2 | 1.3 | 2.0 | 1.5 | 1.9 |
| 3 | 3.5 | 2.0 | 3.9 | 1.8 |
| 4 | 5.1 | 2.0 | 5.9 | 2.0 |
| 5 | 10.0 | 2.0 | 10.7 | 2.0 |

EXAMPLES 6-21

These examples illustrate the preparation of ethylene oxide/propylene oxide derivatives of 2,4,7,9-tetramethyl-5-decyne-4,7-diol (designated S104) and 2,5,8,11-tetramethyl-6-dodecyne-5,8-diol (designated S124) using $BF_3$ catalyst. To our knowledge a procedure for the preparation of ethylene oxide/propylene oxide derivatives of acetylenic diols using Lewis acids such as $BF_3$ has not previously been disclosed. The procedure is illustrated for the preparation of the 5 mole ethylene oxide, 2 mole propylene oxide adduct of 2,4,7,9-tetramethyl-5-decyne-4,7-diol (S104) in which the EO and PO units are randomly situated along the alkylene oxide chain.

A 1000 mL autoclave was charged with the 1.3 mole ethylene oxide adduct of 2,4,7,9-tetramethyl-5-decyne-4,7-diol (313 g, 1.1 moles; Surfynol 104 surfactant from Air Products and Chemicals, Inc.) which had previously been dried by heating under vacuum. The reactor was sealed and pressure checked, the air was removed with three nitrogen pressure-vent cycles. The reactor was pressured to 100 psig (6.7 bar) with nitrogen, and the contents were heated to 40° C. $BF_3$ diethyl etherate (1.3 g) was added and ethylene oxide and propylene oxide were added simultaneously at rates of 91.05 mL/h and 68.95 mL/h, respectively, by means of two syringe pumps. The total amount of ethylene oxide (180 g, 204 mL, 4.08 moles) and propylene oxide (128 g, 155 mL, 2.2 moles) were such that the final mole ratio of diol:EO:PO was 1:5:2. After the completion of the addition, an additional 0.7 g of $BF_3$ diethyl etherate was added, whereupon an exotherm to 45.5° C. was observed. At this point gas chromatographic analysis indicated that the reaction was complete. The product (Example 6) was analyzed by NMR and MALD/I and found to have a structure consistent with the desired structure.

Sixteen similar materials (Examples 7-22) were prepared by variation of the diol structure, the amounts of ethylene oxide and propylene oxide, and the structural motif of the alkylene oxide chain. Table 2 shows the acetylenic diol compositions prepared using $BF_3$ catalysis. In Table 2, R designates "random," while B designates "block."

The composition of Example 22 has been disclosed in JP 03063187 A (however, JP '187 does not teach a method for its preparation nor whether the adduct is a block or random copolymer), and has been shown to have efficacy in fountain solutions for lithographic printing. The S82 designation corresponds to 3,6-dimethyl-4-hexyne-3,6-diol.

TABLE 2

| | | | Theoretical | | Determined by NMR | |
|---|---|---|---|---|---|---|
| Example | Diol | R/B | EO Moles | PO Moles | EO Moles | PO Moles |
| 6 | S104 | R | 5 | 2 | 6.5 | 2.9 |
| 7 | S104 | B | 5 | 2 | 5.5 | 2.2 |
| 8 | S104 | R | 5 | 10 | 3.2 | 11.5 |
| 9 | S104 | B | 5 | 10 | 3.5 | 11.1 |
| 10 | S104 | R | 15 | 2 | 16.2 | 2.2 |
| 11 | S104 | B | 15 | 2 | 14.4 | 2.1 |
| 12 | S104 | R | 15 | 10 | 17.3 | 8.6 |
| 13 | S104 | B | 15 | 10 | 15.0 | 9.7 |
| 14 | S124 | R | 5 | 2 | 6.9 | 3.2 |
| 15 | S124 | B | 5 | 2 | 4.8 | 2.2 |
| 16 | S124 | R | 5 | 10 | 8.0 | 7.6 |
| 17 | S124 | B | 5 | 10 | 5.1 | 10.0 |
| 18 | S124 | R | 15 | 2 | 16.3 | 1.9 |
| 19 | S124 | B | 15 | 2 | 14.9 | 2.1 |
| 20 | S124 | R | 15 | 10 | 15.4 | 9.3 |
| 21 | S124 | B | 15 | 10 | 13.6 | 8.1 |
| 22 | S82 | B | 10 | 2 | 9.6 | 1.9 |

In the following Examples dynamic surface tension data were obtained for aqueous solutions of various compounds using the maximum bubble pressure method at bubble rates from 0.1 bubbles/second (b/s) to 20 b/s. The maximum bubble pressure method of measuring surface tension is described in *Langmuir* 1986, 2, 428-432. These data provide information about the performance of a surfactant at conditions from near-equilibrium (0.1 b/s) through extremely high surface creation rates (20 b/s). In practical terms, high bubble rates correspond to high printing speeds in lithographic printing, high spray or roller velocities in coating applications, and rapid application rates for agricultural products.

COMPARATIVE EXAMPLE 25

Dynamic surface tension data were obtained for aqueous solutions of the composition of Example 22 (S82/10 EO/2PO/B) using the maximum bubble pressure technique. This material has been disclosed in JP 03063187 A and is taught as a component in an aqueous fountain solution composition. The surface tensions were determined at bubble rates from 0.1 bubbles/second (b/s) to 20 b/s. The data are presented in Table 3.

TABLE 3

Dynamic Surface Tension (dyne/cm) - Example 22

| Concentration (wt %) | 0.1 b/s | 1 b/s | 6 b/s | 15 b/s | 20 b/s |
|---|---|---|---|---|---|
| 0.1 | 39.1 | 42.3 | 46.5 | 51.6 | 53.0 |
| 1.0 | 34.4 | 34.9 | 35.5 | 37.7 | 38.5 |
| 5.0 | 33.8 | 34.0 | 34.7 | 36.3 | 36.4 |

The data illustrate that this product is reasonably effective at reducing the surface tension of water, although relatively high concentrations are required to obtain reasonable performance.

EXAMPLE 26

Solutions in distilled water of 10 mole EO/2 mole PO block derivative of 2,4,7,9-tetramethyl-5-decyne-4,7-diol (Example 5) were prepared and their dynamic surface tension properties were measured using the procedure described above. The data are set forth in the Table 4.

TABLE 4

Dynamic Surface Tension (dyne/cm) - Example 5

| Concentration (wt %) | 0.1 b/s | 1 b/s | 6 b/s | 15 b/s | 20 b/s |
|---|---|---|---|---|---|
| 0.1 | 40.5 | 42.0 | 44.3 | 47.1 | 48.1 |
| 0.5 | 32.4 | 33.6 | 35.1 | 36.6 | 37.2 |
| 1.0 | 29.8 | 30.5 | 32.1 | 33.0 | 33.7 |

These data illustrate that the composition of this invention is markedly superior in its ability to reduce surface tension relative to the composition of the prior art. Comparison of the data for the 1.0 wt % solution of the Example 5 surfactant with that of the 5.0 wt % solution of the S82 derivative (Example 22) shows that the compound of the invention provides superior performance at all surface creation rates at 20% the use level. Since reduction of dynamic surface tension is of such importance in a dynamic application in which aqueous fountain solutions are utilized, it would not be anticipated based on the teachings of the prior art that modification of the hydrophobic group (the acetylenic diol moiety) would have such an advantageous effect.

COMPARATIVE EXAMPLES 27-31

Solutions in distilled water of the 1.3, 3.5, 5.1, and 10 mole ethoxylates of 2,4,7,9-tetramethyl-5-decyne-4,7-diol were prepared. The 1.3, 3.5, and 10 mole ethoxylates are marketed by Air Products and Chemicals, Inc. as Surfynol® 420, 440, and 465 surfactants, respectively. Their dynamic surface tensions were measured using the procedure described above, and these data were used to determine the quantities provided in Table 5.

The $pC_{20}$ value is defined as the negative logarithm of the molar concentration of surfactant required to decrease the surface tension of an aqueous solution to 52.1 dyne/cm, that is, 20 dyne/cm below that of pure water when the measurement is performed at 0.1 b/s. This value is a measure of the efficiency of a surfactant. In general, an increase in $pC_{20}$ value of 1.0 indicates that 10 times less surfactant will be require to observe a given effect.

The critical aggregation concentrations (solubility limit or critical micelle concentration) were determined by intersection of the linear portion of a surface tension/ ln concentration curve with the limiting surface tension as is described in many textbooks. The limiting surface tensions at 0.1 and 20 bubbles/second (b/s) represent the lowest surface tensions in water which can be achieved at the given surface creation rate for a given surfactant regardless of the amount of surfactant used. These values give information about the relative ability to a surfactant to reduce surface defects under near-equilibrium condition (0.1 b/s) through very dynamic conditions (20 b/s). Lower surface tensions would allow the elimination of defects upon application of a formulation onto lower energy surfaces.

The foaming properties of 0.1 wt % solutions of the prior art surfactants were examined using a procedure based upon ASTM D 1173-53. In this test, a 0.1 wt % solution of the surfactant is added from an elevated foam pipette to a foam receiver containing the same solution. The foam height is measured at the completion of the addition ("Initial Foam Height") and the time required for the foam to dissipate is recorded ("Time to 0 Foam"). This test provides a comparison between the foaming characteristics of various surfactant solutions. In general, in coatings, inks, and agricultural formulations, foam is undesirable because is complicates handling and can lead to coating and print defects, and to inefficient application of agricultural materials.

TABLE 5

| Structure | $pC_{20}$ | Sol Limit | limiting γ 0.1 b/s | limiting γ 20 b/s | γ (0.1% solution) 1 b/s | γ (0.1% solution) 6 b/s | RM Foam initial (t to 0) |
|---|---|---|---|---|---|---|---|
| Example 27 Surfynol 104 | 3.74 | 0.1 | 32.1 | 40.3 | 33.1 | 36.4 | 2.0 (3 s) |

TABLE 5-continued
| Structure | Sol pC$_{20}$ | Limit | limiting γ 0.1 b/s | 20 b/s | γ (0.1% solution) 1 b/s | 6 b/s | RM Foam initial (t to 0) |
|---|---|---|---|---|---|---|---|
| Example 28 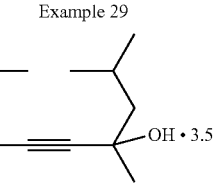 Surfynol 420 | 3.84 | 0.18 | 28.8 | 31.7 | 32.8 | 34.2 | 0.5 (3 s) |
| Example 29 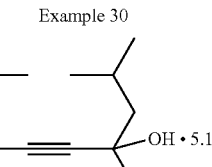 Surfynol 440 | 3.90 | 0.29 | 26.9 | 29.3 | 34.3 | 36.2 | 1.4 (9 s) |
| Example 30 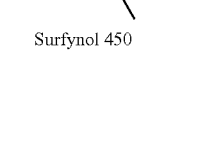 Surfynol 450 | 3.95 | 0.40 | 26.9 | 29.8 | 36.1 | 38.3 | 1.3 (32 s) |
| Example 31 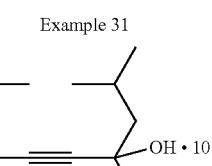 Surfynol 465 | 3.79 | (0.89) | 29.0 | 32.7 | 42.5 | 44.8 | 1.5 (0.6 cm) |
| Example 32 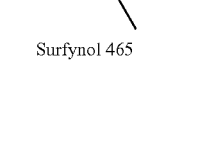 Surfynol 485 | 3.43 | (2.91) | 35.7 | 39.9 | 51.5 | 53.2 | 1.5 (0.6 cm) |

EXAMPLES 33-36

Surface tension and foam data were obtained in a similar manner for the surfactants of Examples 1-4 based on 2,4,7,9-tetramethyl-5-decyne-4,7-diol. The data are set forth in Table 6.

TABLE 6

| Structure | pC$_{20}$ | Sol Limit | limiting γ | | γ (0.1% solution) | | RM Foam initial (t to 0) |
|---|---|---|---|---|---|---|---|
| | | | 0.1 b/s | 20 b/s | 1 b/s | 6 b/s | |
| Example 33 1.3 EO/2 PO (Example 2) | 3.51 | 0.07 | 31.6 | 40.6 | 33.4 | 40.6 | 1.6 (3 s) |
| Example 34 3.5 EO/2 PO (Example 3) | 4.07 | 0.21 | 29.3 | 31.4 | 33.6 | 36.6 | 1.0 (10 s) |
| Example 35 5.1 EO/2 PO (Example 4) | 4.13 | 0.32 | 27.3 | 29.9 | 35.3 | 37.6 | 0.3 (6 s) |
| Example 36 10 EO/2 PO (Example 5) | 4.05 | (0.78) | 29.8 | 33.7 | 42.0 | 44.3 | 2.1 (1.3) |

The data in Table 6 illustrate that propoxylation with 2 moles of propylene oxide in the presence of trimethylamine resulted in surfactants with higher efficiencies than their unpropoxylated counterparts. This effect is reflected in both the pC$_{20}$ values, which increase by about 0.2 units, and the surface tension results for 0.1 wt % solutions at 1 b/s, which decrease by about a dyne/cm. In addition, the foaming characteristics of the surfactants change significantly as a result of modification with propylene oxide. This change can be either in the direction of greater foam (e.g. for the 10 and 30 mole ethoxylates) or to lesser foam (for the 5.1 mole ethoxylate). The ability to control foam is advantageous in many applications, including coatings, inks, adhesives, fountain solutions, agricultural formulations, soaps and detergents.

EXAMPLES 37-52

Solutions in distilled water of the materials of Examples 37-52 were prepared and their surface tension and foam performance were evaluated as in the example above. The results are set forth in the Table 7.

TABLE 7

| Structure | pC$_{20}$ | CAG$^c$ | limiting γ$^a$ | | γ (0.1% solution)$^a$ | | RM Foam$^b$ initial (t to 0) |
|---|---|---|---|---|---|---|---|
| | | | 0.1 b/s | 20 b/s | 1 b/s | 6 b/s | |
| Example 37 104/5/2/R (Example 6) | 4.16 | 0.10 | 28.6 | 31.2 | 30.0 | 37.1 | 1.1 (5 s) |
| Example 38 104/5/2/B (Example 7) | 4.15 | 0.11 | 27.9 | 33.1 | 33.6 | 38.4 | 1.9 (4 s) |
| Example 39 104/5/10/R (Example 8) | 4.50 | 0.04 | 31.2 | 35.0 | 33.7 | 39.9 | 0.5 (1 s) |
| Example 40 104/5/10/B (Example 9) | 4.58 | 0.08 | 31.0 | 34.1 | 37.2 | 40.5 | 0.5 (10 s) |
| Example 41 104/15/2/R (Example 10) | 4.20 | 0.07 | 28.3 | 30.7 | 36.0 | 43.8 | 4.5 (1.1 cm) |
| Example 42 104/15/2/B (Example 11) | 5.04 | 0.18 | 27.6 | 31.7 | 36.8 | 42.9 | 5.3 (0.5 cm) |
| Example 43 104/15/10/R (Example 12) | 4.42 | 0.05 | 28.8 | 30.9 | 33.8 | 44.5 | 2.8 (0.7 cm) |
| Example 44 104/15/10/B (Example 13) | 4.35 | 0.09 | 28.3 | 34.4 | 35.5 | 45.6 | 4.0 (0.4 cm) |
| Example 45 124/5/2/R (Example 14) | 4.39 | 0.03 | 26.5 | 30.8 | 28.2 | 33.5 | 2.4 (0.2 cm) |
| Example 46 124/5/2/B (Example 15) | 4.42 | 0.04 | 26.9 | 29.7 | 28.5 | 32.5 | 3.0 (0.3 cm) |
| Example 47 124/5/10/R (Example 16) | 4.57 | 0.02 | 30.3 | 36.7 | 31.8 | 40.8 | 1.8 (0.3 cm) |
| Example 48 124/5/10/B (Example 17) | 4.56 | 0.02 | 31.3 | 36.2 | 33.4 | 40.3 | 1.4 (12 s) |
| Example 49 124/15/2/R (Example 18) | 4.36 | 0.06 | 27.9 | 32.2 | 30.5 | 40.8 | 2.6 (1.3 cm) |
| Example 50 124/15/2/B (Example 19) | 4.16 | 0.02 | 27.9 | 35.6 | 31.1 | 42.5 | 2.5 (1.2 cm) |
| Example 51 124/15/10/R (Example 20) | 4.58 | 0.06 | 29.1 | 32.3 | 32.8 | 43.2 | 2.0 (1.0 cm) |
| Example 52 124/15/10/B (Example 21) | 4.55 | 0.05 | 28.0 | 33.3 | 33.7 | 41.4 | 4.8 (1.0 cm) |

$^a$dyne/cm.
$^b$Ross-Miles foam: cm (time to 0 foam in seconds or cm after 5 minutes)
$^c$Critical aggregation concentration (wt %).

These data illustrate variation of the acetylenic diol structure, the EO and PO content, and the structural motif of these surfactants allows tailoring of the surfactant properties to a specific application. Surfactants with very low foam (Examples 39 and 40) or relatively high foam (Examples 41 and 42) can be produced. In addition, most of these materials exhibit excellent dynamic surface tension performance, as shown by their limiting surface tension values at 20 b/s. The combination of properties will be of value in many applications, including coatings, inks, adhesives, fountain solutions, agricultural formulations, soaps and detergents.

EXAMPLE 53

2,4,7,9-Tetramethyl-5-decyne-4,7-diol was ethoxylated to produce the 5.1 mole ethoxylate using trimethylamine catalyst and a procedure similar to that of Examples 2-5. A small sample was withdrawn, and sufficient propylene oxide was added to produce the 0.4 mole propoxylate. Again a sample was withdrawn. Similarly, more propylene oxide was added to produce the 0.9 and 1.4 mole propylene oxide adducts. In a separate run, the 2.0 mole propoxylate of the 5.1 mole ethoxylate was prepared.

Surface tension and foam data were obtained for the propoxylates of 5.1 mole ethoxylate of 2,4,7,9-tetramethyl-5-decyne-4,7-diol as described above. The data are set forth in the Table 8.

TABLE 8

| moles PO | γ (0.1 wt % solution)[a] | | | | RM Foam[b] |
|---|---|---|---|---|---|
| | 0.1 b/s | 1 b/s | 6 b/s | 15 b/s | 20 b/s | Initial (t to 0) |
| 0 | 35.1 | 36.2 | 38.1 | 42.0 | 44.4 | 1.6 (0.7 cm) |
| 0.4 | 34.8 | 35.8 | 37.9 | 42.0 | 44.4 | 1.4 (0.3 cm) |
| 0.9 | 34.9 | 35.9 | 38.2 | 42.7 | 45.3 | 1.4 (27 s) |
| 1.4 | 34.6 | 35.9 | 38.3 | 42.0 | 44.5 | 1.2 (21 s) |
| 2.0 | 34.0 | 35.3 | 37.6 | 41.5 | 43.3 | 0.6 (6 s) |

[a]dyne/cm
[b]Initial foam heights in cm (foam height after 5 min, or time to 0 foam).

The data in Table 8 show that while propoxylation has little impact on the surface tension performance of the 5.1 mole ethoxylate of 2,4,7,9-tetramethyl-5-decyne-4,7-diol, it has a significant positive impact on foam control, with greater control observed with higher degrees of propoxylation. Such an effect has not previously been observed with alkoxylated derivatives of acetylenic diols. The ability to control foam is of crucial importance in the application of many waterborne or aqueous-based formulations, because foam generally leads to defects.

In sum, the ability of a surfactant to reduce surface tension under both equilibrium and dynamic conditions is of great importance in the performance of water based coatings, inks, adhesives, fountain solutions and agricultural formulations. Low dynamic surface tension results in enhanced wetting and spreading under the dynamic conditions of application, resulting in more efficient use of the formulations and fewer defects. Foam control is also an important attribute in many applications.

The family of alkoxylated acetylenic diol surfactants disclosed herein provide an ability to control foam while providing excellent dynamic surface tension reduction.

In some of the following examples, the wettability of the process solution was measured on the DSA10 Kruss drop shape analyzer provided by Kruss USA of Charlotte, N.C. using the Sessile drop method. In this method, the wetting properties of a localized region on the surface of a resist-coated substrate are estimated by measuring the contact angle between the baseline of a droplet of aqueous developer solution and the tangent at the droplet base. A high-speed camera captured the spreading of the droplet at a speed of 2 frames per second for 2 minutes and the contact angle was measured.

EXAMPLES 54 through 57

Pre-Treatment of A Resist-Coated Substrate Surface with Process Solutions

Process solutions of surfactant based on 2,5,8,11-tetramethyl-6-dodecyne-5,8-diol (m+n=4, p+q=0), surfactant provided by Air Products and Chemicals, Inc. of Allentown, Pa., were prepared in the following manner. A volumetric flask was charged with varying amounts of the surfactant. A certain amount of DI water was added to the volumetric flask to reach a level of 100 ml at room temperature. The mixture was agitated until the surfactant was dissolved therein to form the process solution. The amounts of surfactant in the process solutions of Examples 54 through 57 are provided in Table 9.

Four 100 mm silicon wafers provided by Wafernet Inc. of San Jose, Calif. were coated with a SFR 510A phenolic resist coating provided by Shipley Inc. of Marlborough, Mass. using a spin coating process at a spin speed of 3200 rpm. The surfaces of resist-coated substrates were pre-wetted with Examples 54 through 57 process solutions. The resist-coated wafer was allowed to dry for a period of 20 seconds to remove excess water. Afterwards, the contact angle of 0.26N TMAH on the resist-coated substrates was measured. Table 9 lists the contact angle values at different drop ages expressed in seconds.

By comparison, deionized water is dispensed via dropper onto the surface of the resist-coated wafer (identical to those used in examples 54-57) that is spinning at a speed of 200 rpm. The resist-coated wafer was allowed to dry for a period of 20 seconds to remove excess water. Afterwards, the contact angle of 0.26N TMAH developer on the resist-coated surface was measured. Table 9 provides the value of the contact angle at different drop ages expressed in seconds.

As Table 9 illustrates, the contact angles of TMAH developer on the resist-coated substrate that were treated with the process solutions of the present invention are smaller than the ones for the resist-coated substrates treated with DI water only. This indicates that surfactants are better adsorbed onto resist-coated surfaces that are treated with the process solutions of the present invention thereby improving the wetting between the developer and resist. Further, higher amounts of surfactant within the process solution may lead to more surfactant adsorption and more improved wetting.

TABLE 9

| Process Solution | Contact Angle (0 seconds) | Contact Angle (5 seconds) | Contact Angle (10 seconds) | Contact Angle (30 seconds) |
|---|---|---|---|---|
| Comp. Ex. - DI water | 51.7 | 49.7 | 48.6 | 45.8 |
| Ex. 54-60 ppm surfactant | 60.5 | 50.4 | 46.6 | 39.4 |
| Ex. 55-125 ppm surfactant | 59.4 | 45.7 | 41.4 | 33.7 |
| Ex. 56-250 ppm surfactant | 49.0 | 40.3 | 37.0 | 31.1 |
| Ex. 57-400 ppm surfactant | 47.3 | 37.4 | 34.5 | 29.1 |

EXAMPLES 58 through 60

Pre-Treatment of Substrate Surface with Process Solutions Containing Isopropyl Alcohol Process solutions containing surfactant were prepared in the following manner. A volumetric flask was charged with varying amounts of surfactant. A certain amount of isopropyl alcohol was added to the volumetric flask to reach a level of 100 ml at room temperature. The mixture was agitated until the surfactant was dissolved therein to form the process solution. The amounts and types of surfactant in the process solutions of Examples 58 through 60 are provided in Table 10. A comparative example in Table 10 contains no surfactant—only isopropyl alcohol (IPA).

Wafers coated with $SiO_2$ or $Si_3N_4$ films were treated with hexamethyldisilazane (HMDS) vapor in an oven to improve the adhesion of the subsequent resist layer (e.g. polymethylglutarimide (PMGI) resist) for lift-off processing. After priming with the HMDS vapor, the surface became very hydrophobic, indicated by the contact angle of water higher than 60°. As a result, the PMGI resist rolled off from the surface, making it difficult to obtain uniform film.

The surface hydrophobicity of the wafers were modified by contacting them with IPA or with examples 58 through 60 process solutions prior to coating the wafers with a resist coating. About 3 mL of the process solution or IPA was dispensed on the wafer surface which was then spun at a speed of 500 rpm. After 5 seconds, the wafer was spun at 3000 rpm until dry. The contact angle of water was then measured on the wafer surface and the results were provided in Table 10.

As Table 10 illustrates, the wafer surface becomes more hydrophilic after treatment with process solutions containing surfactant and isopropyl alcohol solutions because the contact angle is lowered. Consequently, the PMGI solution may no longer rolls off the surface and a uniform resist coating can be obtained more easily.

TABLE 10

| Process Solution | Surfactant | Contact angle (0 seconds) | Contact angle (5 seconds) | Contact angle (10 seconds) | Contact angle (30 seconds) |
|---|---|---|---|---|---|
| Comp Ex. - IPA Only - No surfactant | | 63.5 | 63.3 | 63.2 | 62.5 |
| Ex. 58 - 0.02 wt % | $m + n = 10$, $p + q = 0$ | 58.2 | 58 | 58.2 | 57.8 |
| Ex. 59 - 0.1 wt % | $m + n = 30$, $p + q = 0$ | 46 | 50.4 | 50.9 | 51.5 |
| Ex. 60 - 1.2 wt % | $m + n = 30$, $p + q = 0$ | 29.9 | 42 | 43.1 | 43.5 |

EXAMPLE 61

Number of Post-Development Defects after DI Rinse vs. Process Solution Rinse

The number of post-development defects on a substrate was compared after treating the substrate with a rinse of DI water vs. a rinse containing the process solution of the present invention (example 61). The process solution contained 50 ppm of a 2,5,8,11-tetramethyl-6-dodecyne-5,8-diol-derived surfactant and 170 ppm of the oligomer dispersant SMA® 1440 provided by Elf Alfochem. The substrate was processed in the following manner: a photoresist-coated substrate was exposed to a 365 nm light, heated to a temperature of approximately 110° C. for a time of about 1 minute and then developed to form a patterned photoresist with a dilute TMAH solution. The TMAH solution was applied by dynamically dispensing a 0.21N TMAH solution onto the substrate for a period of 100 seconds.

As a comparison, a rinse containing DI water started 15 seconds before the developer nozzle was turned off and continued for a period of 7 minutes. The substrate was inspected for defects using the TereStar® KLA-Tencor defect inspection tool provided by KLA-Tencor Inc. of San Jose, Calif. and the defects were classified and counted. The results of the inspection are provided in Table 11.

The substrate was processed in the same manner as the deionized rinse comparison using the same developer and process conditions. However, after 100 seconds of developing, a process solution comprising an acetylenic diol surfactant (example 61)—rather than deionized water—was used to rinse the patterned photoresist-coated surface. The overlapping period with the developer was the same as in comparative example 3. After a 120 second rinse with the process solution, a DI water rinse was used for another 7 minutes. The substrate was inspected for defects using the TereStar® KLA-Tencor defect inspection tool and the defects were classified and counted. The results of the inspection are provided in Table 12.

As Table 12 illustrates, the process solution of the present invention was able to completely remove the photoresist residues from the patterned photoresist surface. By contrast, Table 11 shows that were many defects resulting from residual photoresist and other sources after rinsing with DI water. Therefore, rinsing the substrate with the process solution of the present invention effectively eliminated the number of post-development defects and improved the process yield.

TABLE 11

Post-Development Defects after DI Water Rinse

| Defect Types | Small | Medium | Large | Extra large | Total |
|---|---|---|---|---|---|
| Pattern Defect | 0 | 55 | 35 | 1 | 91 |
| Pinholes/Dots | 0 | 148 | 2 | 0 | 150 |
| Total | 0 | 203 | 37 | 1 | 241 |

TABLE 12

Post-Development Defects after Process solution Rinse

| Defect Types | Small | Medium | Large | Extra large | Total |
|---|---|---|---|---|---|
| Pattern Defect | 0 | 0 | 0 | 0 | 0 |
| Pinholes/Dots | 0 | 0 | 0 | 0 | 0 |
| Total | 0 | 0 | 0 | 0 | 0 |

EXAMPLE 62

Comparison of Equilibrium Surface Tension and Dynamic Surface Tension of Process Solution vs. Solutions Containing Fluorosurfactant Process solutions containing 0.1 weight percent of a surfactant derived from 2,5,8,11-tetramethyl-6-dodecyne-5,8-diol or containing a fluorosurfactant, potassium perfluorooctane carboxylate provided by 3M of St. Louis, Mo. were prepared in order to compare the equilibrium surface tension (EST) and dynamic surface tension (DST). The EST for both solutions was measured using the Wilhemy plate method on a Kruss BP3 bubble pressure tensiometer manufactured by Kruss, Inc. of Charlotte, N.C. The DST of each process solution was measured via the maximum bubble pressure method. The results of the EST and DST tests are provided in Table 13.

Referring to Table 13, while the fluorosurfactant exhibits a lower EST compared to the process solution of the present invention, the significantly lower DST indicates that the fluorosurfactant exhibits poor dynamic surface tension reduction ability. For applications that require high surface creation rates such as dynamic rinse processes used in semiconductor manufacturing, the process solution of the present invention would be more suitable than solutions containing fluorosurfactants due to its lower DST value.

TABLE 13

| Rinse Composition (0.1 wt %) | EST (dyne/cm) | DST (cm/cm) |
|---|---|---|
| Example 62 | 25.8 | 28.4 |
| Fluorosurfactant | 21.2 | 72.4 |

EXAMPLE 63

Pattern Collapse Reduction

Example process solutions were prepared by adding 0.05 weight percent of 2,4,7,9-tetramethyl-4,7-decane diol to deionized water under continuous stirring. A substrate was processed in the following manner: a silicon wafer provided by Wafernet, Inc. and coated with an anti-refelective coating was coated with a TOK 6063 193 nm photoresist and exposed to a 193 nm light with a ASML PAS 5500/1100 scanner, heated to a temperature of approximately 115° C. for a time of about 1 minute, and then developed to form a patterned photoresist with a dilute TMAH solution. The TMAH developer solution was applied by dynamically dispensing a 0.26N TMAH solution onto the substrate and allowed to set for a period of 45 seconds. The process solution was then dynamically dispensed onto the substrate surface while the wafer substrate slowly spun at 500 rpm to distribute the solution on the substrate surface. The dispense process lasted for a period of 15 seconds. Afterwards, the substrate was spun at 3,500 rpm to dry.

As a comparison, a deionized water rinse solution was applied to the substrate surface after the development of the patterned photoresist coating with a TMAH developer solution under the same process conditions as the Example 63 process solution.

The critical dimensions ("CD") of the features of each wafer were measured with a Hitachi CD-SEM tool on 37 sites per wafer, and pattern collapse was visually observed through the top-down SEM images. The wafers were exposed under the same dose energy of 16.5 mJ/cm$^2$. The results of the visual observations are provided in Table 14.

As shown in Table 14, the process solutions of the present invention reduced the collapsed sites by at least half while increasing the aspect ratio from 3 to 3.3. Therefore, rinsing the substrate with the process solution of the present invention rather than with deionized water effectively reduced the pattern collapse when patterning high aspect ratio features.

TABLE 14

Pattern Collapse Data

| Rinse Solution | Aspect Ratio | % sites with collapsing |
|---|---|---|
| DI Water | 3.0 | 97 |
| Example 63 | 3.1 | 6 |

EXAMPLE 64 and 65

Immersion in Water Bath after Treatment with Process Solution-Change in Surface Hydrophobicity Process solutions containing 0.3 weight percent 2,4,7,9-tetramethyl-5-decyne-4,7-diol (m+n=5, p+q=2) (Formula II, example 64) and 0.35 weight percent 2,4,7,9-tetramethyl-5-decyne-4,7-diol (m+n=10) (Formula I, example 65) were prepared in the following manner. A volumetric flask was charged with varying amounts of the surfactant and DI water to reach a level of 100 ml at room temperature. The mixture was agitated until the surfactant was dissolved therein to form the process solution. A substrate was treated with the process solutions, or with deionized water as a comparison, by dispensing a measured amount of process solution upon the wafer while it was being spun continuously for about 1 minute at 100 rpm. The substrate was then immersed in a water bath for 60 seconds. The contact angle of water droplets on the surface of the low dielectric constant film was measured and the results are provided in Table 15. Treatment with deionized water only shows a slight decrease of contact angle from the wafer surface thereby indicating a slight change of surface hydrophobicity just from the process alone.

Table 15 illustrates that after immersing the substrate in the water bath for 60 seconds, the process solution containing the surfactant washed away from the low dielectric constant surface. The low dielectric constant surface is once again very hydrophobic. The process solutions wets the surface very quickly in a dynamic fashion yet can be readily removed from the surface even in a static manner such as simple immersion. This was also confirmed by measuring the dielectric constant of the film. As shown in Table 16, treatment with process solution and subsequent immersion in DI water bath has not changed the dielectric constant of the film.

TABLE 15

| Example | Amt Surfactant | Contact Angle (0 sec) | Contact Angle (5 sec) | Contact Angle (10 sec) | Contact Angle (30 sec) |
|---|---|---|---|---|---|
| Comp. Ex. - DI water | 0 | 80.7 | 80.7 | 80.7 | 79.7 |
| Ex. 64 | 0.3 wt % | 81.8 | 80.9 | 81.0 | 80.3 |
| Ex. 65 | 0.35 wt % | 81.7 | 81.1 | 81.1 | 80.8 |

TABLE 16

| | Dielectric Constant | Refractive Index |
|---|---|---|
| Blank | 2.27 | 1.38 |
| Ex. 64 | 2.28 | 1.38 |
| Ex. 65 | 2.27 | 1.38 |

We claim:

1. A process solution comprising:
   a carrier medium selected from the group consisting of an aqueous solvent, a non-aqueous solvent, and combinations thereof; and
   an alkoxylated acetylenic diol surfactant having the formula A:

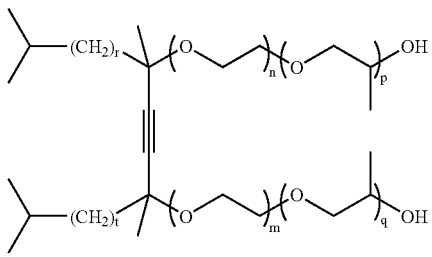

where r and t are 1 or 2, (n +m) is 1 to 30 and (p +q) is 1 to 30.

2. The process solution of claim 1 further comprising at least one base.

3. The process solution of claim 1 further comprising at least one oxidizing agent.

4. The process solution of claim 1 further comprising at least one chelating agent.

5. The process solution of claim 1 further comprising at least one corrosion inhibitor.

6. The process solution of claim 1 further comprising an additive selected from a stabilizer, a dissolving aid, a colorant, a wetting agent, an antifoamer, a buffering agent, a second surfactant, and combinations thereof.

7. The process solution of claim 1 further comprising a dispersant.

8. A process solution consisting of:
a carrier medium selected from the group consisting of an aqueous solvent, a non-aqueous solvent, and combinations thereof; and
at least one alkoxylated acetylenic diol surfactant having the formula (II):

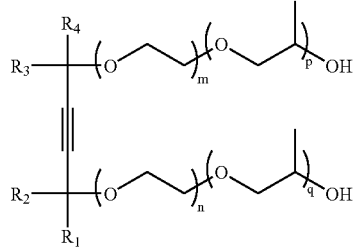

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20.

9. A process solution consisting of water, optionally a non-aqueous solvent, and at least one alkoxylated acetylenic diol surfactants having the formula (II):

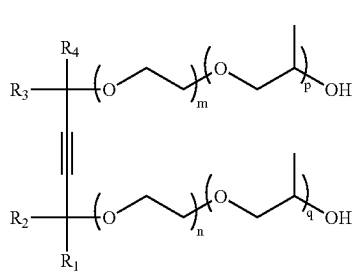

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20 and wherein the at least one acetylenic diol surfactants is present in an amount sufficient to reduce the dynamic surface tension and/or equilibrium surface tension of the process solution.

10. A process solution comprising:
water;
at least one non-aqueous solvent selected from a water miscible alcohol, glycol, polyol and combinations thereof wherein the non-aqueous solvent has from 2 to 12 carbon atoms; and
an alkoxylated acetylenic diol surfactant having the formula A:

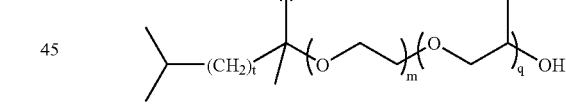

where r and t are 1 or 2, (n +m) is 1 to 30 and (p +q) is 1 to 30.

* * * * *